United States Patent
Moriyama

(10) Patent No.: US 10,483,148 B2
(45) Date of Patent: Nov. 19, 2019

(54) PROTECTIVE TAPE AND METHOD FOR MANUFACTURING SEMICONDUCTOR DEVICE

(71) Applicant: DEXERIALS CORPORATION, Tokyo (JP)

(72) Inventor: Hironobu Moriyama, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/765,358

(22) PCT Filed: Oct. 18, 2016

(86) PCT No.: PCT/JP2016/080777
§ 371 (c)(1),
(2) Date: Apr. 2, 2018

(87) PCT Pub. No.: WO2017/069102
PCT Pub. Date: Apr. 27, 2017

(65) Prior Publication Data
US 2018/0286737 A1    Oct. 4, 2018

(30) Foreign Application Priority Data

Oct. 19, 2015    (JP) .................. 2015-205647

(51) Int. Cl.
*H01L 21/683* (2006.01)
*H01L 23/29* (2006.01)
(Continued)

(52) U.S. Cl.
CPC .......... *H01L 21/6836* (2013.01); *H01L 21/56* (2013.01); *H01L 21/563* (2013.01);
(Continued)

(58) Field of Classification Search
CPC ................ H01L 21/6836; H01L 21/3043
See application file for complete search history.

(56) References Cited

U.S. PATENT DOCUMENTS 7,452,752 B2    11/2008    Noda et al.
8,501,879 B2    8/2013    Kondo et al.
(Continued)

FOREIGN PATENT DOCUMENTS

JP    2005-028734 A    2/2005
JP    2005-159155 A    6/2005
(Continued)

OTHER PUBLICATIONS

Jan. 10, 2017 Search Report issued in International Patent Application No. PCT/JP2016/080777.
(Continued)

Primary Examiner — Farun Lu
(74) Attorney, Agent, or Firm — Oliff PLC

(57) ABSTRACT

A protective tape including an adhesive agent layer, a thermoplastic resin layer, and a matrix film layer in this order to a surface of a wafer on which a bump electrode is formed; grinding a surface of the wafer opposite to the surface on which the protective tape is pasted; pasting an adhesive tape to the ground surface of the wafer; peeling the protective tape so that the adhesive agent layer remains and other layers are removed; dicing the wafer to which the adhesive tape is pasted to obtain individual semiconductor chips; and curing the adhesive agent layer before dicing; the adhesive agent layer after curing has a shear storage modulus of 3.0E+08 Pa to 5.0E+09 Pa, and the ratio of the thickness of the adhesive agent layer of the protective tape before pasting to the height of the bump electrode is 1/30 to 1/6.

15 Claims, 5 Drawing Sheets

(51) Int. Cl.
*H01L 23/31* (2006.01)
*H01L 21/56* (2006.01)
*H01L 21/78* (2006.01)
*H01L 23/00* (2006.01)

(52) U.S. Cl.
CPC .............. *H01L 21/78* (2013.01); *H01L 23/29* (2013.01); *H01L 23/31* (2013.01); *H01L 23/3114* (2013.01); *H01L 23/3157* (2013.01); *H01L 24/27* (2013.01); *H01L 24/73* (2013.01); *H01L 24/81* (2013.01); *H01L 2221/6834* (2013.01); *H01L 2221/68327* (2013.01); *H01L 2221/68336* (2013.01); *H01L 2221/68377* (2013.01); *H01L 2221/68386* (2013.01); *H01L 2224/11* (2013.01); *H01L 2224/27003* (2013.01); *H01L 2224/73104* (2013.01); *H01L 2224/8121* (2013.01); *H01L 2224/81815* (2013.01)

(56) References Cited

U.S. PATENT DOCUMENTS

| | | |
|---|---|---|
| 2007/0077685 A1 | 4/2007 | Noda et al. |
| 2009/0221215 A1 | 9/2009 | Kawashima et al. |
| 2012/0208009 A1 | 8/2012 | Oda et al. |
| 2013/0323345 A1 | 12/2013 | Blackshear et al. |
| 2016/0042986 A1* | 2/2016 | Takamoto ........... H01L 21/6836 438/125 |
| 2016/0064297 A1 | 3/2016 | Morita et al. |
| 2016/0075871 A1* | 3/2016 | Morita ................ H01L 21/6836 438/118 |

FOREIGN PATENT DOCUMENTS

| | | |
|---|---|---|
| JP | 2005-239884 A | 9/2005 |
| JP | 2009-206435 A | 9/2009 |
| JP | 2012-074623 A | 4/2012 |
| JP | 2014-192238 A | 10/2014 |
| JP | 2015-520519 A | 7/2015 |
| KR | 10-2006-0108698 A | 10/2006 |
| KR | 10-2012-0044903 A | 5/2012 |
| KR | 10-2012-0093771 A | 8/2012 |

OTHER PUBLICATIONS

May 14, 2019 Office Action issued in Japanese Patent Application No. 2015-205647.

Jul. 15, 2019 Office Action issued in Korean Patent Application No. 10-2018-7003904.

* cited by examiner

PROTECTIVE TAPE AND METHOD FOR MANUFACTURING SEMICONDUCTOR DEVICE

TECHNICAL FIELD

The present disclosure relates to a protective tape used in manufacturing semiconductor devices and also relates to a method for manufacturing a semiconductor device. This application claims priority to Japanese Patent Application No. 2015-205647 filed on Oct. 19, 2015, the entire content of which is hereby incorporated by reference.

BACKGROUND ART

Conventional post-processing in manufacturing processes of flip-chip mounting semiconductors is performed in the following manner. First, to a bump formation surface of a wafer on which a plurality of bump electrodes (bumps) are formed, a protective sheet or tape, known as back grind tape, is pasted to protect the bumps; in this configuration, a side opposite to the bump electrode formation surface is ground to a predetermined thickness. After completing the grinding, the back grind tape is peeled, and the wafer is diced to obtain individual semiconductor chips. Next, the semiconductor chips are flip-chip mounted onto other semiconductor chips or substrates. Then, an underfill is cured to reinforce the semiconductor chip.

For example, PLT 1 describes a method for using a thermosetting resin layer and a thermoplastic resin layer laminated together as a back grind tape, and only the thermosetting resin layer is left on the bump formation surface of the wafer and other layers are removed.

CITATION LIST

Patent Literature

PLT 1: Japanese Unexamined Patent Application Publication No. 2005-28734

SUMMARY OF INVENTION

Technical Problem

In semiconductor manufacturing processes, it is desired to suppress wafer chipping (wafer cracking) at the time of dicing and improve solder bonding properties after mounting the semiconductor chip.

However, with conventional back grind tape, when leaving only the thermosetting resin layer and removing other layers, resin remains on the bumps which, for example, can impede solder bonding during reflow and degrade connection properties. Therefore, with conventional back grind tape, it is difficult to suppress wafer chipping during dicing while simultaneously achieving good solder bonding properties.

The present disclosure has been proposed in view of such conventional circumstances and provides a method for manufacturing a semiconductor device capable of suppressing wafer chipping during dicing while achieving good solder bonding properties after mounting semiconductor chips.

Solution to Problem

A method for manufacturing a semiconductor device according to the present invention includes the steps of: pasting a protective tape to a surface of a wafer on which a bump electrode is formed, the protective tape having an adhesive agent layer, a thermoplastic resin layer, and a matrix film layer in this order; grinding a surface of the wafer opposite to the surface on which the protective tape is pasted; pasting an adhesive tape to the ground surface of the wafer; peeling the protective tape so that the adhesive agent layer remains and other layers are removed; dicing the wafer to which the adhesive tape is pasted to obtain individual semiconductor chips; and curing the adhesive agent layer before dicing, wherein the adhesive agent layer after curing has a shear storage modulus of 3.0E+08 Pa to 5.0E+09 Pa, and wherein the ratio of the thickness of the adhesive agent layer of the protective tape before pasting to the height of the bump electrode (the thickness of the adhesive agent layer before pasting/the height of the bump electrode) is 1/30 to 1/6.

The protective tape according to the present disclosure includes an adhesive agent layer, a thermoplastic resin layer, and a matrix film layer in this order, and the adhesive agent layer is to be adhered to a surface of a wafer on which a bump electrode is formed; the adhesive agent layer after curing has a shear storage modulus of 3.0E+08 Pa to 5.0E+09 Pa, and the ratio of the thickness of the adhesive agent layer before pasting to the height of the bump electrode (the thickness of the adhesive agent layer before pasting/the height of the bump electrode) is 1/30 to 1/6.

Advantageous Effects of Invention

Using a protective tape having an adhesive agent layer, a thermoplastic resin layer, and a matrix film layer in this order, wherein the adhesive agent layer after curing has a shear storage modulus of 3.0E+08 Pa to 5.0E+09 Pa, and wherein the ratio of the thickness of the adhesive agent layer before pasting to the height of the bump electrode (the thickness of the adhesive agent layer before pasting/the height of the bump electrode) is 1/30 to 1/6, can suppress wafer chipping during dicing while achieving good solder bonding properties after mounting semiconductor chips.

DESCRIPTION OF EMBODIMENTS

Embodiments of the present disclosure will now be described in detail according to the following order.

1. Protective Tape
2. Method for Manufacturing Semiconductor Device

Protective Tape

A protective tape according to the present embodiment includes an adhesive agent layer, a thermoplastic resin layer, and a matrix film layer in this order, and the adhesive agent layer is to be adhered to a surface of a wafer on which a bump electrode is formed; the adhesive agent layer after curing has a shear storage modulus of 3.0E+08 Pa to 5.0E+09 Pa, and the ratio of the thickness of the adhesive agent layer before pasting to the height of the bump electrode (the thickness of the adhesive agent layer before pasting/the height of the bump electrode) is 1/30 to 1/6. This protective tape can suppress wafer chipping while improving solder bonding properties.

Figure 1:
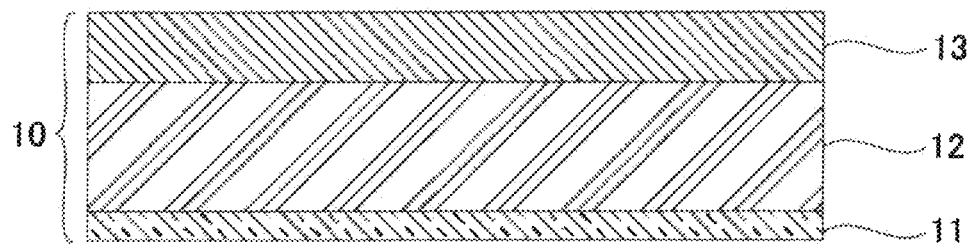
FIG. 1 is a cross-sectional view schematically illustrating a protective tape.

FIG. 1 is a schematic cross-sectional view illustrating a protective tape. A protective tape 10, known as back grind tape, protects a wafer from defects such as scratches, cracks, and contamination in a grinding step. As illustrated in FIG. 1, the protective tape 10 includes, in the following order, an adhesive agent layer 11, a thermoplastic resin layer 12, and a matrix film layer 13.

Figure 2:
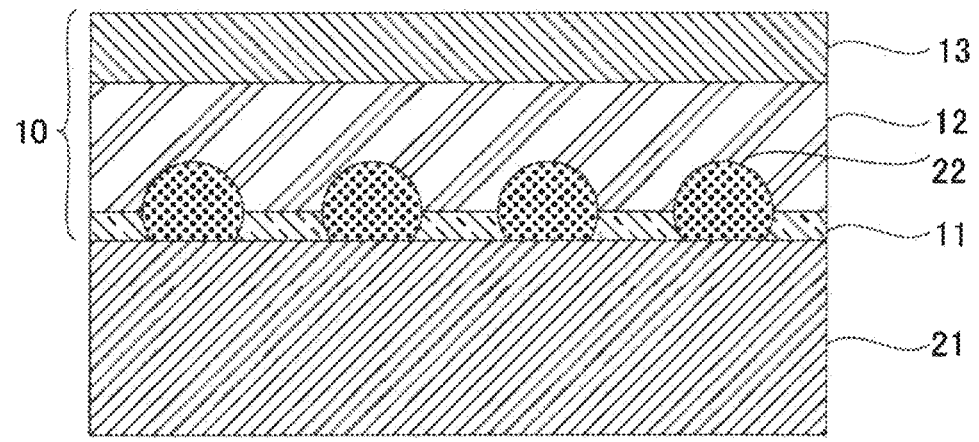
FIG. 2 is a cross-sectional view schematically illustrating a protective tape pasting step.

FIG. 2 is schematic cross-sectional view illustrating a protective tape pasting step. The adhesive agent layer 11 of the protective tape 10 is pasted to a surface of the wafer 21 on which bump electrodes 22 are formed.

Adhesive Agent Layer

The ratio of the thickness of the adhesive agent layer 11 before pasting to the wafer 21 (hereinafter also referred to as "the thickness of the adhesive agent layer") to the height of the bump electrode 22 (the thickness of the adhesive agent layer/the height of the protruded electrode) is 1/30 to 1/6, and more preferably 1/30 to 1/6. The ratio of the thickness of the adhesive agent layer 11 to the height of the bump electrode 22 being 1/30 or more (0.03 or more) can sufficiently reinforce the bump electrode 22 when the wafer 21 is diced, thereby suppressing chipping of the wafer 21. In addition, the ratio of the thickness of the adhesive agent layer 11 to the height of the bump electrode 22 being 1/6 or less (0.17 or less) can suppress the residual resin on the bump electrode 22 when peeling the protective tape 10 such that the adhesive agent layer 11 remains and other layers (the thermoplastic resin layer 12 and the matrix film layer 13) are removed, thereby improving solder bonding properties.

For example, when the height of the bump electrode 22 is 100 to 300 µm, the thickness of the adhesive agent layer 11 is preferably 10 to 30 µm.

The shear storage modulus of the adhesive agent layer 11 after curing is preferably 3.0E+08 Pa to 5.0E+09 Pa, and more preferably 1.0E+09 Pa to 4.0E+09 Pa. The shear storage modulus of the adhesive agent layer 11 after curing being 3.0E+08 Pa or more can sufficiently reinforce the bump electrode 22 when the wafer 21 is diced, thereby suppressing wafer chipping. In addition, the shear storage modulus of the adhesive layer 11 after curing being 5.0E+09 Pa or less can suppress excessive amount of the filler in the adhesive layer 11, thereby improving solder bonding properties between the semiconductor chip on which the solder bumps are formed as the bump electrodes 22 and the circuit substrate. In other words, the shear storage modulus of the adhesive agent layer 11 after curing exceeding 5.0E+09 Pa reduces the fluidity of the adhesive agent layer 11 before curing and degrades the solder bonding properties since it is necessary to increase the amount of filler added in the adhesive agent layer 11 compared with the case where the shear storage modulus of the cured adhesive agent layer 11 is 5.0E+09 Pa or less.

The shear storage modulus (Gn) of the adhesive agent layer 11 at 60° C. is preferably 1.0E+01 Pa to 1.0E+05 Pa. The shear storage modulus of the adhesive agent layer 11 being 1.0E+01 Pa or more can effectively suppress the resin of the adhesive agent layer 11 from flowing when the protective tape 10 is pasted to the wafer 21. In addition, by setting the shear storage modulus of the adhesive agent layer 11 to 1.0E+05 Pa or less, the bump electrode 22 can penetrate through the adhesive agent layer 11 more easily, thus improving the connection properties.

Examples of adhesive agent compositions which may be used in the adhesive agent layer 11 include, without particular limitation, thermosetting types such as anionic thermosetting, cationic thermosetting, and radical thermosetting, and photosetting types such as cationic photosetting and radical photosetting types; these may also be used in combination.

Herein, as an example of an adhesive agent composition for forming the adhesive agent layer 11, a thermosetting adhesive agent composition containing a film-forming resin, an epoxy resin, a curing agent, a curing accelerator, and a filler will be described.

Examples of the film-forming resin include phenoxy resins, acrylic resin, epoxy resins, modified epoxy resins, and urethane resins, among others. These film-forming resins may be used individually or in a combination of two or more. Among these, in view of film-formed state and connection reliability properties, among other considerations, phenoxy resin and acrylic resin are preferably used.

Examples of epoxy resin include dicyclopentadiene epoxy resin, glycidyl ether epoxy resin, glycidylamine epoxy resin, bisphenol A epoxy resin, bisphenol F epoxy resin, bisphenol S epoxy resin, spirocyclic epoxy resin, naphthalene epoxy resin, biphenyl epoxy resin, terpene epoxy resin, tetrabromobisphenol A epoxy resin, cresol novolac epoxy resin, phenol novolac epoxy resin, α-naphthol novolac epoxy resin, and brominated phenol novolac type epoxy resin, among others. These epoxy resins may be used individually or in a combination of two or more. Among these, in view of high adhesiveness and heat resistance, a dicyclopentadiene epoxy resin is preferably used.

Examples of curing agents that may be used include novolac phenol resins, aliphatic amines, aromatic amines, and acid anhydrides; these curing agents may be used individually or in a combination of two or more. Among these, in view of crosslink density in a cured product, a novolac phenol resin is preferably used.

Examples of curing accelerators that may be used are imidazoles such as 2-methylimidazole, 2-ethylimidazole, and 2-ethyl-4-methylimidazole, tertiary amines such as 1,8-diazabicyclo[5.4.0]undec-7-ene (DBU), 2-(dimethylaminomethyl)phenol, phosphines such as triphenylphosphine, and metallic compounds such as stannous octoate. Among these, 2-ethyl-4-methylimidazole is preferable.

Examples of fillers include inorganic fillers such as silica, aluminum nitride, and alumina, among others. The filler is preferably surface-treated and is preferably a hydrophilic inorganic filler. Examples of hydrophilic inorganic fillers include those in which the inorganic filler is surface-treated with a hydrophilic surface treatment agent. Examples of hydrophilic surface treatment agents include silane coupling agent, titanate coupling agent, aluminum coupling agent, zircoaluminate coupling agent, $Al_2O_3$, $TiO_2$, $ZrO_2$, silicone, and aluminum stearate, among others; a silane coupling agent is preferably used.

The content of the filler in the adhesive agent composition is preferably 3 to 35% by mass, and more preferably from 25 to 35% by mass. This range of the content of the filler makes it possible to easily adjust the shear storage modulus of the cured adhesive agent layer 11 within the above-described range. A single material or two or more materials may be used as the filler. When two or more types of fillers are used in a combination, it is preferable that the total amount of the filler meets the above-described range of the content.

Furthermore, other constituents such as silane coupling agents, elastomers such as acrylic rubber, and pigments such as carbon black may be blended in the adhesive agent composition as appropriate according to purpose.

Thermoplastic Resin Layer

Examples of resins used in the thermoplastic resin layer 12 include ethylene vinyl acetate (EVA), polyethylene, polypropylene, polyamide, polyacetal, polyethylene terephthalate, polybutylene terephthalate, flurororesins, polyphenylene sulfide, polystyrene, ABS (Acrylonitrile Butadiene Styrene) resin, acrylic resins, polycarbonate, polyurethane, polyvinyl chloride, and polyphenylene oxide, among others. The above resins may be used individually or in a combination of two or more.

The shear storage modulus of the thermoplastic resin layer 12 at 60° C. is preferably 1.0E+07 Pa or less. This range can further improve embedding properties of the bump electrode 22 in the adhesive agent layer 11.

The thermoplastic resin layer 12 has a thickness of, for example, 5 to 300 μm.

Matrix Film Layer

Examples of the matrix film layer 13 include plastic films such as those of polyethylene terephthalate, polyethylene, polypropylene, and polyester, as well as porous matrix materials such as paper, cloth, and nonwoven fabric.

The matrix film layer 13 has a thickness of, for example, 25 to 200 μm.

The protective tape 10 according to the present embodiment includes the adhesive agent layer 11, the thermoplastic resin layer 12, and the matrix film layer 13 in this order, the adhesive agent layer 11 after curing has a shear storage modulus of 3.0E+08 Pa to 5.0E+09 Pa, and the ratio of the thickness of the adhesive agent layer 11 to the height of the bump electrode 22 is 1/30 to 1/6, so that wafer chipping can be suppressed and solder bonding properties can be improved.

It should be noted that the protective tape is not limited to the configuration described above, and other layers may be formed on the surface of any layer or between any adjacent layers.

The protective tape according the present embodiment can be formed, for example, by laminating the matrix film layer 13 and the thermoplastic resin layer 12 in this order to form a laminated body which is then laminated to the adhesive agent layer 11. The adhesive agent layer 11 can be obtained, for example, by preparing the above-described thermosetting adhesive agent composition, applying this to a release-treated matrix using a bar coater, and drying. The matrix film layer 13/thermoplastic resin layer 12 laminated body can be manufactured by extruding a melted thermoplastic resin onto the matrix film layer 13.

2. Method for Manufacturing Semiconductor Device

Next, a method for manufacturing a semiconductor device using the aforementioned protective tape will be described. The method for manufacturing a semiconductor device according to this embodiment includes the steps of pasting the above-described protective tape 10 to a surface of the wafer 21 on which the bump electrode 22 is formed, grinding a surface of the wafer 22 opposite to the surface on which the protective tape is pasted; pasting an adhesive tape to the ground surface of the wafer 22; peeling the protective tape 10 so that the adhesive agent layer 11 remains and other layers are removed; dicing the wafer 21 to which the adhesive tape is pasted to obtain individual semiconductor chips; and curing the adhesive agent layer 11 before dicing. Herein, a curing step of curing an adhesive layer 11 may be performed before any of the grinding step, an adhesive tape pasting step, and a dicing step. By curing the adhesive agent layer 11 before dicing in this manner, the bump electrode 22 can be reliably protected in a later process such as dicing, picking-up, and mounting.

Hereinafter, an example of the method for manufacturing a semiconductor device will be described. This example of the method for manufacturing a semiconductor device uses the protective tape described above and the curing step is performed between the adhesive tape pasting step and the dicing step. Thus, this example of the method for manufacturing a semiconductor device includes a protective tape pasting step (A), a grinding step (B), an adhesive tape pasting step (C), a protective tape peeling step (D), a curing step of curing the adhesive agent layer (E), a dicing step (F), an expanding step (G), a picking-up step (H), and a mounting step (I).

(A) Protective Tape Pasting Step

As illustrated in FIG. 1 and FIG. 2, the protective tape pasting step includes pasting the protective tape 10 to the surface of the wafer 21 on which the bump electrodes 22 are formed. A pasting temperature at which the protective tape 10 is pasted is preferably 25 to 100° C. and more preferably 40 to 80° C. in view of reducing voids, improving tight contact with the wafer, and preventing warping of the wafer after grinding. The protective tape 10 preferably satisfies the above-described ratio of the thickness of the adhesive agent layer 11 to the height of the bump electrode 22 before being pasted to the wafer 21.

The wafer 21 has an integrated circuit formed on a surface of a semiconductor such as silicon and the bump electrode 22 used for connecting. Thickness of the wafer 21 is without particular limitation but is preferably 200 to 1,000 μm.

Examples of the bump electrode 22 include, without particular limitation, solder-containing low-melting point bumps or high-melting point bumps, tin bumps, silver-tin bumps, silver-tin-copper bumps, gold bumps, and copper bumps, among others. The height of the bump electrode 22 can be appropriately selected within a range that satisfies the above-described ratio of the thickness of the adhesive agent layer 11 to the height of the bump electrode 22, and can be, for example, 100 to 300 μm.

The protective tape 10 is pasted in a state in which the formation surface of the bump electrode 22 and the adhesive agent layer 11 are in contact with each other. As illustrated in FIG. 2, the bump electrode 22 penetrates the adhesive agent layer 11 and embeds into the thermoplastic resin layer 12.

Grinding Step (B)

Figure 3:
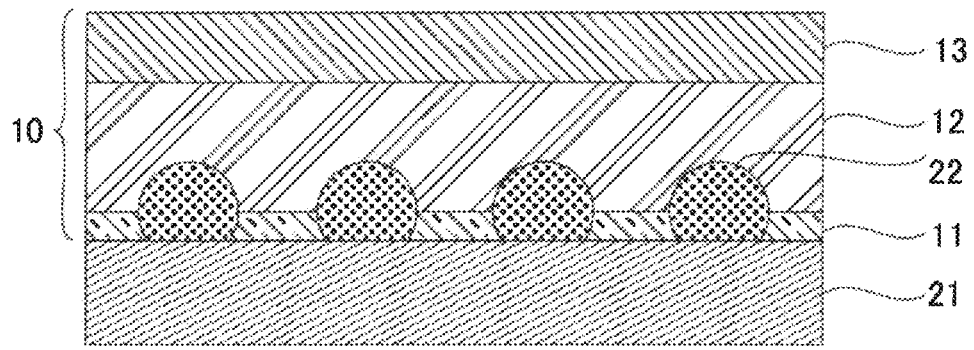
FIG. 3 is a cross-sectional view schematically illustrating a grinding step.

FIG. 3 is a schematic cross-sectional view illustrating a grinding step. The grinding step includes grinding a surface of the wafer 21 opposite to the side on which the protective tape 10 is pasted, thus, the surface opposite to the surface on which the bump electrode 22 is formed is secured to a grinding device and ground. Grinding is typically performed until the wafer 21 has a thickness of 50 to 600 μm; however, in the present embodiment, the opposite surface of the wafer 21 may be ground to a thickness of 50 μm or less because the bump 22 is reinforced by the adhesive agent layer 11 by satisfying the above-described ratio of the thickness of the adhesive agent layer 11 to the height of the bump electrode 22.

Adhesive Tape Pasting Step (C)

Figure 4:
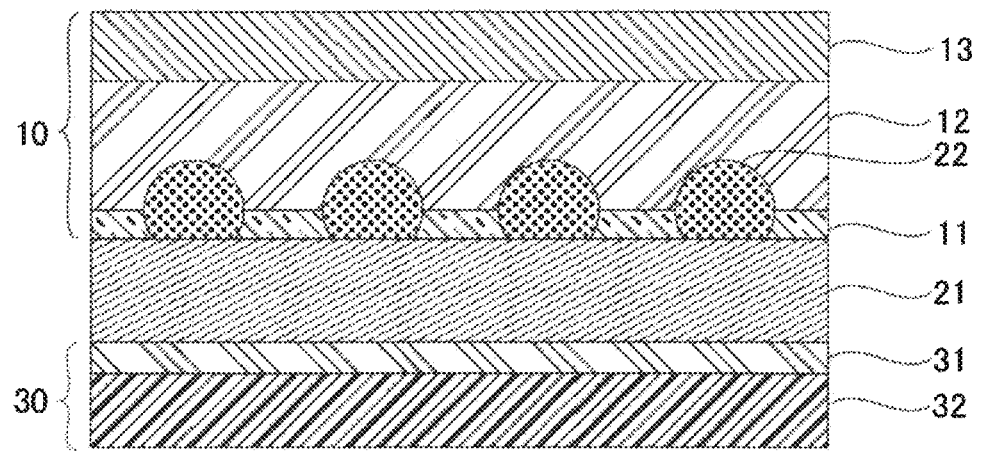
FIG. 4 is a cross-sectional view schematically illustrating the adhesive tape pasting step.

FIG. 4 is a cross-sectional view illustrating an adhesive tape pasting step. The adhesive tape pasting step includes pasting an adhesive tape 30 onto the surface of the wafer 21 which has been ground. The adhesive tape 30, known as dicing tape, protects and secures the wafer 21 during the dicing step (F) and holds the wafer 21 until the picking-up step (H).

The adhesive tape 30 is without particular limitation and known adhesive tapes may be used. Typically, the adhesive tape 30 includes a pressure-sensitive adhesive agent layer 31 and a matrix film layer 32. Examples of the pressure-sensitive adhesive agent layer 31 include polyethylene-based, acrylic-based, rubber-based, and urethane-based pressure-sensitive adhesives, among others. Moreover, examples of the matrix film layer 32 include plastic films such as those of polyethylene terephthalate, polyethylene, polypropylene, and polyester, as well as porous matrix materials such as those of paper, cloth, and nonwoven fabric. Adhesive tape pasting devices and conditions are without particular limitation and known devices and conditions may be employed.

Protective Tape Peeling Step (D)

Figure 5:
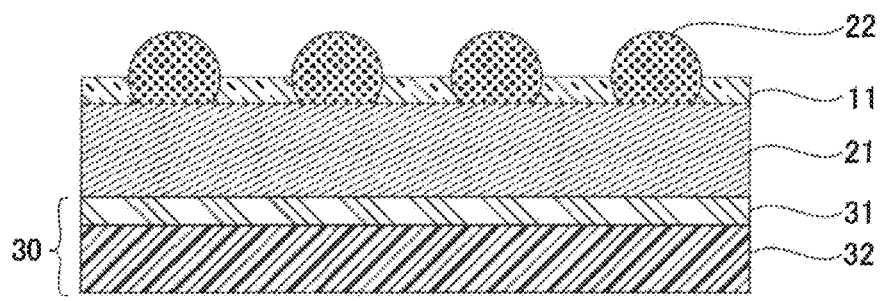
FIG. 5 is a cross-sectional view schematically illustrating a protective tape peeling step.

FIG. 5 is a schematic cross-sectional view illustrating a protective tape peeling step. The protective tape peeling step includes peeling the protective tape 10 so that the adhesive agent layer 11 remains and other layers, or the thermoplastic resin layer 12 and the matrix film layer 13, are removed. Thus, only the adhesive agent layer 11 remains on the wafer 21.

Curing Step (E)

Figure 6:
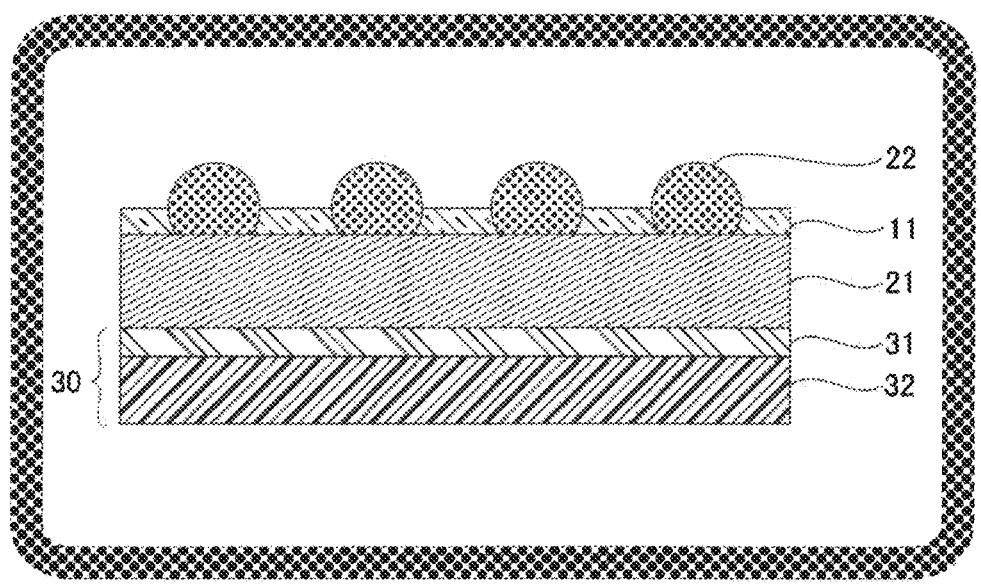
FIG. 6 is a cross-sectional view schematically illustrating a curing step.

FIG. 6 is a schematic cross-sectional view illustrating a curing step. The curing step includes curing the adhesive agent layer 11. Regarding curing methods and curing conditions, known methods for curing thermosetting adhesive agents can be used. For example, preferable curing conditions are 100 to 200° C. for one hour.

Dicing Step (F)

Figure 7:
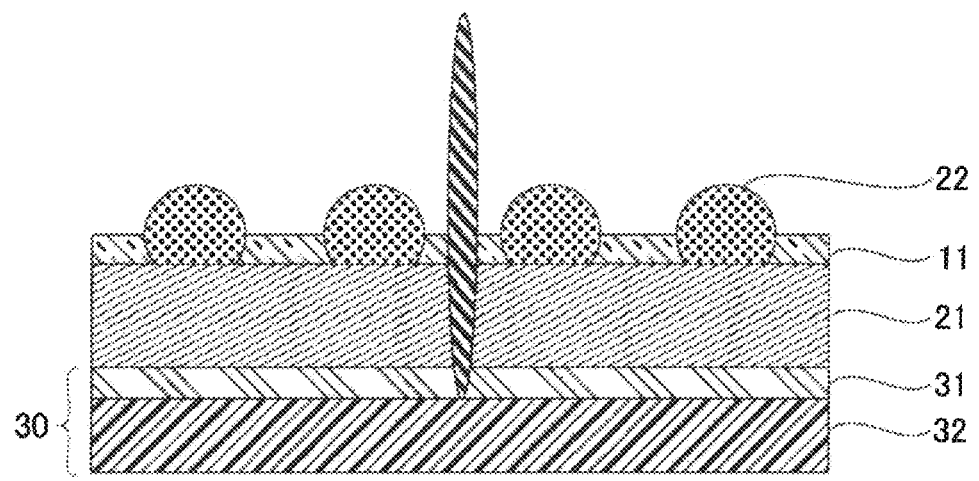
FIG. 7 is a cross-sectional view schematically illustrating a dicing step.

FIG. 7 is a schematic cross-sectional view illustrating a dicing step. The dicing step includes dicing the wafer 21, to which the adhesive tape 30 is pasted, to obtain individual semiconductor chips. The dicing method is without particular limitation, and known methods such as, for example, cutting apart the wafer 21 with a dicing saw may be employed.

Expanding Step (G)

Figure 8:
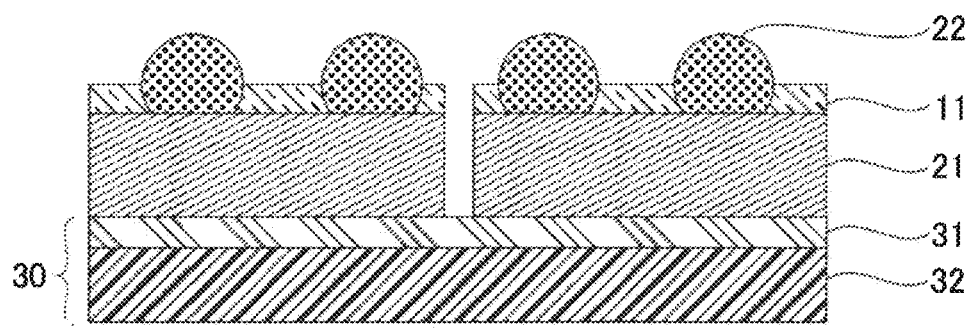
FIG. 8 is a cross-sectional view schematically illustrating an expanding step.

FIG. 8 is a schematic cross-sectional view illustrating an expanding step. The expanding step includes horizontally stretching the adhesive tape 30, on which a plurality of separated individual semiconductor chips are adhered, to increase distances between the individual semiconductor chips.

Picking-Up Step (H)

Figure 9:
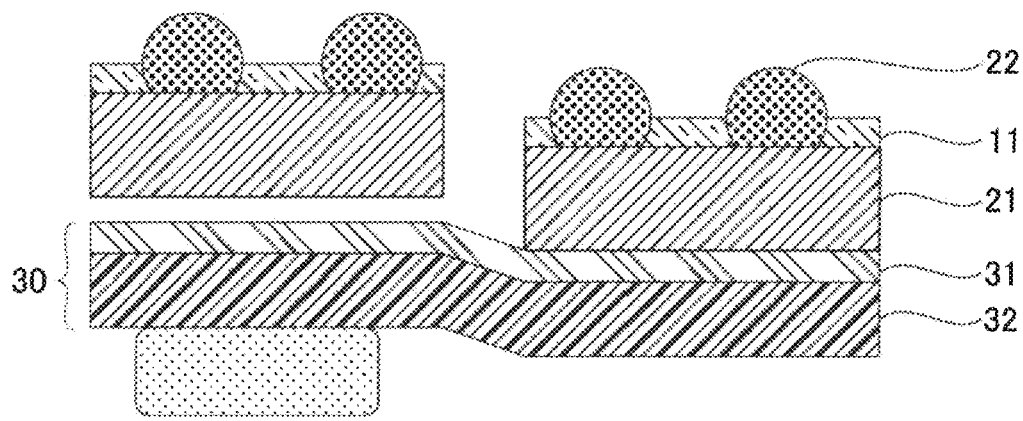
FIG. 9 is a cross-sectional view schematically illustrating a picking-up step.

FIG. 9 is a schematic cross-sectional view illustrating a picking-up step. The picking-up step includes detaching the semiconductor chips from the adhesive tape 30, on which the semiconductor chips are secured by adhesion, by pressing the underside surface of the adhesive tape 30; the detached semiconductor chips are suctioned up by a collet. The picked-up semiconductor chips are collected in a chip tray or are conveyed to a chip-mounting nozzle of a flip-chip bonder.

Mounting Step (I)

Figure 10:
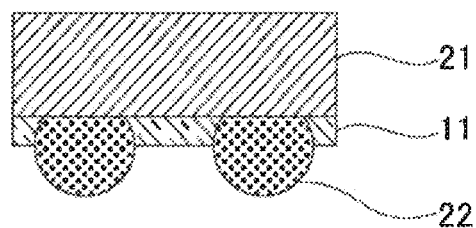
FIG. 10 is a cross-sectional view schematically illustrating a mounting step.

FIG. 10 is a schematic cross-sectional view illustrating a mounting step. The mounting step includes, for example, connecting a semiconductor chip and a circuit substrate using a circuit connecting material such as NCF (Non-Conductive Film). The circuit substrate is without particular limitation and plastic substrates such as polyimide substrates, glass epoxy substrates, and ceramic substrates can be used. Furthermore, as a connection method, known methods such as those using thermal-bonding or reflow ovens can be used.

The above-described method for manufacturing a semiconductor device can suppress chipping of the wafer 21 during dicing while achieving good solder bonding properties after mounting semiconductor chips. Since the adhesive agent layer 11 on the surface of the wafer 21 on which the bump electrodes 22 are formed is cured before dicing, the bump electrode 22 can be reliably protected in a later process such as dicing, picking-up, and mounting. In addition, a semiconductor device having excellent connection reliability can be obtained with good yield.

The semiconductor device obtained by the above-described method for manufacturing a semiconductor device includes a semiconductor chip having a cured adhesive agent layer formed on the surface on which the bump electrodes 22 are formed, and a circuit substrate having electrodes facing the bump electrodes 22, thus achieving an excellent connection reliability.

EXAMPLES

Hereinafter, examples according to the present disclosure will be described. In the present examples, protective tapes were prepared by laminating an adhesive agent layer, a thermoplastic resin layer, and a matrix film layer. Using the protective tapes, a protective tape pasting step (A), a grinding step (B), an adhesive tape pasting step (C), a protective tape peeling step (D), a curing step (E), a dicing step (F), an expanding step (G), a picking-up step (H), and a mounting step (I) were sequentially performed to prepare semiconductor devices. Then, the presence or absence of wafer chipping during dicing and the solder bonding properties in the semiconductor devices were evaluated. It should be noted that the present invention is not limited to these examples.

Shear Storage Modulus

Shear storage moduli of the adhesive agent layers and the thermoplastic resin layers were measured using a viscoelasticity measuring device. Measurement conditions were a temperature range of 0 to 120° C. with a temperature raising rate of 5° C./min, a frequency of 1 Hz, and a deformation of 0.1%.

Protective Tape Preparation

Thermoplastic Resin Layer Preparation On a PET (polyethylene terephthalate) matrix (thickness 75 μm), a thermoplastic resin (propylene-olefin copolymer resin (Notio PN0040 Mitsui Chemicals, Inc.)) was extruded such that the thermoplastic resin would have a thickness of 500 μm after drying. The shear storage modulus of the thermoplastic resin layer at 60° C. was 1.4 E+05 Pa.

Adhesive Agent Layer Preparation

As shown in Table 1, the following components were blended to prepare an adhesive agent layer.

Film-forming resin: phenoxy resin (PKHH, manufactured by Union Carbide Corporation)

Film-forming resin: acrylic acid copolymer (SG-80, manufactured by Nagase ChemteX Corporation)

Epoxy resin: dicyclopentadiene epoxy resin (HP7200H, manufactured by DIC Corporation)

Curing agent: novolac phenol resin (TD-2093, manufactured by DIC Corporation)

Curing accelerator: 2-ethyl-4-methylimidazole (2E4MZ)

Filler: silica (Aerosil RY 200, Nippon Aerosil Co., Ltd.)

Adhesive Agent Layer No. 1-1

To prepare an adhesive agent composition, 13.0 pts. mass of a phenoxy resin, 54.8 pts. mass of an epoxy resin, 32.4 pts. mass of a curing agent, 0.3 pts. mass of a curing accelerator, and 33 pts. mass of a filler were blended. This adhesive agent composition was applied to release-treated PET such that the adhesive agent composition would have a thickness of 20 μm after drying, and the adhesive agent composition was dried to obtain an adhesive agent layer No. 1-1.

Adhesive Agent Layer No. 1-2

An adhesive agent layer No. 1-2 was prepared in the same manner as in the adhesive agent layer No. 1-1 except that the adhesive agent composition was applied to release-treated PET such that adhesive agent composition would have a thickness of 10 μm after drying.

Adhesive Agent Layer No. 1-3

An adhesive agent layer No. 1-3 was prepared in the same manner as in the adhesive agent layer No. 1-1 except that the adhesive agent composition was applied to release-treated PET such that adhesive agent composition would have a thickness of 30 μm after drying.

Adhesive Agent Layer No. 1-4

An adhesive agent layer No. 1-4 was prepared in the same manner as in the adhesive agent layer No. 1-1 except that the adhesive agent composition was applied to release-treated PET such that adhesive agent composition would have a thickness of 5 μm after drying.

Adhesive Agent Layer No. 1-5

An adhesive agent layer No. 1-5 was prepared in the same manner as in the adhesive agent layer No. 1-1 except that the adhesive agent composition was applied to release-treated PET such that adhesive agent composition would have a thickness of 40 μm after drying.

Adhesive Agent Layer No. 2

To prepare an adhesive agent composition, 80.0 pts. mass of an acrylic acid copolymer, 54.8 pts. mass of an epoxy resin, 32.4 pts. mass of a curing agent, 0.3 pts. mass of a curing accelerator, and 5.0 pts. mass of a filler were blended. This adhesive agent composition was applied to release-treated PET such that the adhesive agent composition would have a thickness of 20 μm after drying, and the adhesive agent composition was dried to obtain an adhesive agent layer No. 2.

Adhesive Agent Layer No. 3

To prepare an adhesive agent composition, 13.0 pts. mass of a phenoxy resin, 54.8 pts. mass of an epoxy resin, 32.4 pts. mass of a curing agent, 0.3 pts. mass of a curing accelerator, and 55.0 pts. mass of a filler were blended. This adhesive agent composition was applied to release-treated PET such that the adhesive agent composition would have a thickness of 20 μm after drying, and the adhesive agent composition was dried to obtain an adhesive agent layer No. 3.

Adhesive Agent Layer No. 4

To prepare an adhesive agent composition, 160.0 pts. mass of an acrylic acid copolymer, 54.8 pts. mass of an epoxy resin, 32.4 pts. mass of a curing agent, 0.3 pts. mass of a curing accelerator, and 5.0 pts. mass of a filler were blended. This adhesive agent composition was applied to release-treated PET such that the adhesive agent composition would have a thickness of 20 μm after drying, and the adhesive agent composition was dried to obtain an adhesive agent layer No. 4.

Adhesive Agent Layer No. 5

To prepare an adhesive agent composition, 13.0 pts. mass of a phenoxy resin, 54.8 pts. mass of an epoxy resin, 32.4 pts. mass of a curing agent, 0.3 pts. mass of a curing accelerator, and 100.0 pts. mass of a filler were blended. This adhesive agent composition was applied to release-treated PET such that the adhesive agent composition would have a thickness of 20 μm after drying, and the adhesive agent composition was dried to obtain an adhesive agent layer No. 5.

TABLE 1

| | | | adhesive agent layer | | | | | | | | |
|---|---|---|---|---|---|---|---|---|---|---|---|
| | | trade name | No. 1-1 | No. 1-2 | No. 1-3 | No. 1-4 | No. 1-5 | No. 2 | No. 3 | No. 4 | No. 5 |
| adhesive agent composition | film-forming resin | PKHH | 13.0 | 13.0 | 13.0 | 13.0 | 13.0 | — | 13.0 | — | 13.0 |
| | | SG-80 | — | — | — | — | — | 80.0 | — | 160.0 | — |
| | epoxy resin | HP7200H | 54.8 | 54.8 | 54.8 | 54.8 | 54.8 | 54.8 | 54.8 | 54.8 | 54.8 |
| | curing agent | TD-2093 | 32.4 | 32.4 | 32.4 | 32.4 | 32.4 | 32.4 | 32.4 | 32.4 | 32.4 |
| | curing accelerator | Imidazole(2E4MZ) | 0.3 | 0.3 | 0.3 | 0.3 | 0.3 | 0.3 | 0.3 | 0.3 | 0.3 |
| | filler | AerosilRY200 | 33.3 | 33.3 | 33.3 | 33.3 | 33.3 | 5.0 | 55.0 | 5.0 | 100.0 |
| | | total | 133.8 | 133.8 | 133.8 | 133.8 | 133.8 | 172.5 | 155.5 | 252.5 | 200.5 |
| | | filler amount(% by mass) | 25 | 25 | 25 | 25 | 25 | 3 | 35 | 2 | 50 |
| | | adhesive agent layer thickness before pasting (μm) | 20 | 10 | 30 | 5 | 40 | 20 | 20 | 20 | 20 |

Example 1

The above-described thermoplastic resin layer and the adhesive agent layer No. 1-1 were laminated to prepare a protective tape.

Example 2

The above-described thermoplastic resin layer and the adhesive agent layer No. 1-2 were laminated to prepare a protective tape.

Example 3

The above-described thermoplastic resin layer and the adhesive agent layer No. 1-3 were laminated to prepare a protective tape.

Example 4

The above-described thermoplastic resin layer and the adhesive agent layer No. 2 were laminated to prepare a protective tape.

Example 5

The above-described thermoplastic resin layer and the adhesive agent layer No. 3 were laminated to prepare a protective tape.

Comparative Example 1

The above-described thermoplastic resin layer and the adhesive agent layer No. 1-4 were laminated to prepare a protective tape.

Comparative Example 2

The above-described thermoplastic resin layer and the adhesive agent layer No. 1-5 were laminated to prepare a protective tape.

Comparative Example 3

The above-described thermoplastic resin layer and the adhesive agent layer No. 4 were laminated to prepare a protective tape.

Comparative Example 4

The above-described thermoplastic resin layer and the adhesive agent layer No. 5 were laminated to prepare a protective tape.

Semiconductor Device Preparation

The adhesive agent layer surfaces of the protective tapes were pasted and laminated at 60° C. with a vacuum laminator onto wafers (size: 5 cm×5 cm×700 μm thick) on which solder bumps (φ=250 μm, H=200 μm, pitch=250 μm) were formed.

Next, a grinder (DFG8560 manufactured by DISCO Corporation) was used to backgrind to a wafer thickness of 300 μm. Subsequently, the protective tape was peeled so that the adhesive agent layers remained and other layers (PET matrix and thermoplastic resin layers) were removed before curing the adhesive agent layers on the wafers in an oven at 130° C. for two hours. The wafers were then diced and the chips were separated before being mounted with a mounting device to substrates (gold electrodes with flux) and solder bonded with a reflow oven at a maximum temperature of 260° C.

Solder Bonding Properties Evaluation

Areas over which the solder had wet and spread were measured, against a reference value of 100% representing area for the bump size, after applying flux onto the gold electrodes of the substrates and solder bonding with reflow at a maximum temperature of 260° C. Solder bonding properties were evaluated as good when the solder wet and spread over an area of 50% or more, and not good when less than 50%, with respect to the area for the bump size. Results are represented in Tables 2 and 3 below.

Wafer Chipping Evaluation

Separated chips were observed with a microscope (×100); the chips with chipping of 10 μm or more were evaluated as "fail" (hereinafter represented as "F") and the chips without chipping of 10 μm or more were evaluated as "pass" (hereinafter represented as "P"). Results from Examples and Comparative Examples are represented in Tables 2 and 3 below.

TABLE 2

|  | Ex. 1 | Ex. 2 | Ex. 3 | Ex. 4 | Ex. 5 |
| --- | --- | --- | --- | --- | --- |
| adhesive agent layer No. | No. 1-1 | No. 1-2 | No. 1-3 | No. 2 | No. 3 |
| adhesive agent layer thickness before pasting (μm) | 20 | 10 | 30 | 20 | 20 |
| bump electrode height (μm) | 200 | 200 | 200 | 200 | 200 |
| adhesive agent layer thickness before pasting (μm)/bump electrode height (μm) | 1/10 | 1/20 | 1/6.7 | 1/10 | 1/10 |
| adhesive agent layer shear storage modulus after curing (Pa) | 2.4E+09 | 2.4E+09 | 2.4E+09 | 7.2E+08 | 4.2E+09 |
| wafer chipping | P | P | P | P | P |
| solder bonding properties (%) | 90 | 98 | 87 | 85 | 83 |

TABLE 3

|  | Comp. 1 | Comp. 2 | Comp. 3 | Comp. 4 |
| --- | --- | --- | --- | --- |
| adhesive agent layer No. | No. 1-4 | No. 1-5 | No. 4 | No. 5 |
| adhesive agent layer thickness before pasting (μm) | 5 | 40 | 20 | 20 |
| bump electrode height (μm) | 200 | 200 | 200 | 200 |
| adhesive agent layer thickness before pasting (μm)/bump electrode height (μm) | 1/40 | 1/5 | 1/10 | 1/10 |
| adhesive agent layer shear storage modulus after curing (Pa) | 2.4E+09 | 2.4E+09 | 1.4E+08 | 6.3E+09 |
| wafer chipping | F | P | F | P |
| solder bonding properties (%) | 102 | 31 | 81 | 46 |

As in Examples 1 to 5, in the cases of using a protective tape having an adhesive agent layer, a thermoplastic resin layer, and a matrix film layer in this order, in which the adhesive agent layer after curing had a shear storage modulus of 3.0E+08 Pa to 5.0E+09 Pa, and the ratio of the thickness of the adhesive agent layer to the height of the bump electrode was 1/30 to 1/6, it was found that wafer chipping was suppressed and solder bonding properties were good.

In particular, as in Examples 1 and 2, in the cases of using a protective tape in which the adhesive agent layer after curing had a shear storage modulus of 1.0E+09 Pa to 4.0E+09 Pa, and the ratio of the thickness of the adhesive agent layer to the height of the bump electrode was 1/30 to 1/6, it was found that solder bonding properties were further improved.

As in Comparative Example 1, in the case of using a protective tape in which the ratio of the thickness of the adhesive agent layer to the height of the bump electrode was less than 1/30, it was found that suppressing wafer chipping was difficult.

As in Comparative Example 2, in the case of using a protective tape in which the ratio of the thickness of the adhesive agent layer to the height of the bump electrode exceeded 1/6, it was found that solder bonding properties were not good.

As in Comparative Example 3, in the case of using a protective tape in which the adhesive agent layer after curing has a shear storage modulus of less than 3.0E+08, it was found that suppressing wafer chipping was difficult.

As in Comparative Example 4, in the case of using a protective tape in which a shear storage modulus of the adhesive agent layer after curing exceeded 5.0E+09, it was found that solder bonding properties were not good.

REFERENCE SIGNS LIST 10 protective tape, 11 adhesive agent layer, 12 thermoplastic resin layer, 13 matrix film layer, 21 wafer, 22 bump electrode, 30 adhesive tape, 31 adhesive agent layer, 32 matrix film layer

The invention claimed is:

1. A method for manufacturing a semiconductor device, the method comprising:
    pasting a protective tape to a surface of a wafer on which a bump electrode is formed, the protective tape having an adhesive agent layer, a thermoplastic resin layer, and a matrix film layer in this order;
    grinding a surface of the wafer opposite to the surface on which the protective tape is pasted;
    pasting an adhesive tape to the ground surface of the wafer;
    peeling the protective tape so that the adhesive agent layer remains and other layers are removed;
    dicing the wafer to which the adhesive tape is pasted to obtain individual semiconductor chips; and
    curing the adhesive agent layer before dicing, wherein:
    the adhesive agent layer after curing has a shear storage modulus of 3.0E+08 Pa to 5.0E+09 Pa, and
    the ratio of the thickness of the adhesive agent layer of the protective tape before pasting to the height of the bump electrode is 1/30 to 1/6.

2. The method according to claim 1, wherein:
    the adhesive agent layer is formed using an adhesive agent composition, and
    the adhesive agent composition contains a film-forming resin, a thermosetting resin, a curing agent, and a filler, and the content of the filler in the adhesive agent composition is 3 to 35% by mass.

3. The method according to claim 1, wherein:
    the adhesive agent layer is formed using an adhesive agent composition, and
    the adhesive agent composition contains a film-forming resin, a thermosetting resin, a curing agent, and a filler, and the content of the filler in the adhesive agent composition is 25 to 35% by mass.

4. The method according to claim 1, wherein the thickness of the adhesive agent layer of the protective tape before pasting is 10 to 30 μm.

5. The method according to claim 1, wherein the height of the bump electrode is 100 to 300 μm.

6. The method according to claim 1, further comprising bonding the individual semiconductor chip and a substrate having an electrode with flux in a reflow oven, wherein the bump electrode of the individual semiconductor chip is a solder bump.

7. The method according to claim 2, wherein the thickness of the adhesive agent layer of the protective tape before pasting is 10 to 30 μm.

8. The method according to claim 3, wherein the thickness of the adhesive agent layer of the protective tape before pasting is 10 to 30 μm.

9. The method according to claim 2, wherein the height of the bump electrode is 100 to 300 μm.

10. The method according to claim 3, wherein the height of the bump electrode is 100 to 300 μm.

11. The method according to claim 4, wherein the height of the bump electrode is 100 to 300 μm.

12. The method according to claim 2, further comprising bonding the individual semiconductor chip and a substrate having an electrode with flux in a reflow oven, wherein the bump electrode of the individual semiconductor chip is a solder bump.

13. The method according to claim 3, further comprising bonding the individual semiconductor chip and a substrate having an electrode with flux in a reflow oven, wherein the bump electrode of the individual semiconductor chip is a solder bump.

14. The method according to claim 4, further comprising bonding the individual semiconductor chip and a substrate having an electrode with flux in a reflow oven, wherein the bump electrode of the individual semiconductor chip is a solder bump.

15. The method according to claim 5, further comprising bonding the individual semiconductor chip and a substrate having an electrode with flux in a reflow oven, wherein the bump electrode of the individual semiconductor chip is a solder bump.

* * * * *